(12) United States Patent
Okabe et al.

(10) Patent No.: US 9,472,383 B2
(45) Date of Patent: Oct. 18, 2016

(54) COPPER OR COPPER ALLOY TARGET/COPPER ALLOY BACKING PLATE ASSEMBLY

(75) Inventors: Takeo Okabe, Ibaraki (JP); Hirohito Miyashita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1457 days.

(21) Appl. No.: 10/596,653

(22) PCT Filed: Nov. 30, 2004

(86) PCT No.: PCT/JP2004/017744
§ 371 (c)(1),
(2), (4) Date: Jun. 20, 2006

(87) PCT Pub. No.: WO2005/064036
PCT Pub. Date: Jul. 14, 2005

(65) Prior Publication Data
US 2007/0051624 A1    Mar. 8, 2007

(30) Foreign Application Priority Data
Dec. 25, 2003  (JP) .................................. 2003-428520

(51) Int. Cl.
| H01J 37/34 | (2006.01) |
| C23C 14/34 | (2006.01) |
| C22C 9/10 | (2006.01) |
| C22C 9/06 | (2006.01) |
| C22C 25/00 | (2006.01) |

(52) U.S. Cl.
CPC ............. *H01J 37/3435* (2013.01); *C22C 9/06* (2013.01); *C22C 9/10* (2013.01); *C22C 25/00* (2013.01); *C23C 14/3414* (2013.01)

(58) Field of Classification Search
CPC .. H01J 37/3435; C23C 14/3414; C22C 9/06; C22C 9/10; C22C 25/00; C22C 9/00
USPC ................ 148/522; 204/298.13; 219/121.66; 228/115, 164, 194
See application file for complete search history.

(56) References Cited

U.S. PATENT DOCUMENTS

| 2,126,386 A * | 8/1938 | Hensel et al. ................ 420/494 |
| 3,301,717 A * | 1/1967 | Scherbner ..................... 148/554 |
| 5,269,899 A | 12/1993 | Fan |
| 6,361,662 B1 | 3/2002 | Chiba et al. |
| 6,521,108 B1 * | 2/2003 | Zhang ...................... 204/298.13 |
| 6,579,431 B1 * | 6/2003 | Bolcavage et al. ....... 204/298.13 |
| 6,619,537 B1 * | 9/2003 | Zhang et al. ................. 228/194 |
| 6,774,339 B1 * | 8/2004 | Smathers et al. ........ 219/121.66 |
| 6,793,124 B1 * | 9/2004 | Takahashi et al. ............ 228/194 |
| 6,849,139 B2 * | 2/2005 | Kardokus et al. ............ 148/522 |
| 7,114,643 B2 * | 10/2006 | Ivanov et al. ................. 228/115 |
| 7,431,195 B2 * | 10/2008 | Facey et al. .................. 228/164 |
| 2003/0116425 A1 | 6/2003 | Okabe et al. |
| 2004/0166017 A1 * | 8/2004 | Caron et al. .................. 420/492 |
| 2005/0051606 A1 * | 3/2005 | Perrot et al. .................. 228/193 |
| 2005/0121320 A1 | 6/2005 | Okabe et al. |
| 2005/0285273 A1 | 12/2005 | Okabe et al. |
| 2006/0088436 A1 | 4/2006 | Okabe et al. |
| 2007/0107185 A1 | 5/2007 | Bailey et al. |
| 2008/0197017 A1 | 8/2008 | Yi et al. |

FOREIGN PATENT DOCUMENTS

| EP | 0881311 A1 | 12/1998 |
| JP | H01-096374 A | 4/1989 |
| JP | 01180975 A * | 7/1989 |
| JP | 01180976 A * | 7/1989 |
| JP | H03-079734 A | 4/1991 |
| JP | H03-134170 A | 6/1991 |
| JP | 07268617 A * | 10/1995 | ............. C23C 14/34 |
| JP | 10168532 A * | 6/1998 |
| JP | H11-236665 A | 8/1999 |
| JP | 2001-329362 A | 11/2001 |
| WO | 01/00899 A1 | 1/2001 |
| WO | 2005/007920 A2 | 1/2005 |
| WO | 2005/019493 A2 | 4/2005 |

OTHER PUBLICATIONS

Alloy definition from Merriam-Webster Online Dicitonary: http://www.merriam-webster.com/dictionary/alloy [Accessed on Nov. 4, 2009].*
Esp@cenet database, English Abstract of JP 03-079734, Apr. 1991.
Esp@cenet database, English Abstract of JP 01-180975, Jul. 1989.
Esp@cenet database, English Abstract of JP 11-236665, Aug. 1999.
Esp@cenet database, English Abstract of WO 01/00899, Jan. 2001.
Esp@cenet database, English Abstract of JP 2001-329362, Nov. 2001.
Esp@cenet database, English Abstract of JP 03-134170, Jun. 1991.
Y. Koshiba et al., "Mitsubishi's Materials' High Performance Oxygen Free Copper and High Performance Alloys", Second International Conference on Processing Materials for Properties, Abstract Only, Nov. 2000.

* cited by examiner

*Primary Examiner* — Michael Band
(74) *Attorney, Agent, or Firm* — Howson & Howson, LLP

(57) ABSTRACT

Provided is a copper or copper alloy target/copper alloy backing plate assembly in which the anti-eddy current characteristics and other characteristics required in a magnetron sputtering target are simultaneously pursued in a well balanced manner. This copper or copper alloy target/copper alloy backing plate assembly is used for magnetron sputtering, and the copper alloy backing plate is formed from low beryllium copper alloy or Cu—Ni—Si-based alloy. Further, with this copper or copper alloy target/copper alloy backing plate assembly, the copper alloy backing plate has electrical conductivity of 35 to 60% (IACS), and 0.2% proof stress of 400 to 850 MPa.

10 Claims, No Drawings

COPPER OR COPPER ALLOY TARGET/COPPER ALLOY BACKING PLATE ASSEMBLY

BACKGROUND OF THE INVENTION

The present invention relates to a copper or copper alloy target/copper alloy backing plate assembly having characteristics required in a magnetron sputtering target.

In recent years, sputtering is being employed for forming a thin film to be used in semiconductor devices and various electronic components. As well known, this sputtering method is a deposition method of irradiating charged particles toward a target, sputtering particles from the target with the impact strength of such particles, facing the foregoing target and forming a thin film, which is primarily composed of the target material substance, on a substrate such as a wafer.

A target used in this sputtering deposition method is usually formed in a tabular shape or discoid shape, and this target is generally bonded to a backing plate.

Since the target will be subject to a significant impact of the charged particles during sputtering, temperature of the target will rise gradually.

Thus, it is necessary to cool the target, and, with most targets, a material (backing plate) with high thermal conductance such as aluminum alloy, stainless steel or oxygen free copper is bonded to the back face thereof via soldering, diffusion bonding, pressure bonding or bonding using the anchor effect in order to form a target-backing plate assembly.

And, in order to cool this backing plate from the outside via a cooling means, a cooling plate also having high thermal conductance is additionally bonded thereto in order to absorb the heat of the target.

In recent years, sputtering is being conducted with higher power, and copper alloy having high strength, high thermal conductance, and high electrical conduction property is being widely used as the backing plate material. Further, bonding of the target and backing plate is often conducted solidly with the diffusion bonding method or the like.

Conventional technology is briefly described below.

There is an example of engaging and bonding a sputtering target to a beryllium copper alloy backing plate (for instance, refer to Patent Document 1), and an example of diffusion bonding an aluminum alloy target/Cu-1% Cr backing plate (for instance, refer to Patent Document 2).

Further, a copper alloy backing plate having a 0.2% proof stress of 200 MPa or greater; for instance, a copper alloy having Cu-0.7 to 1.2 wt % Cr and in which the total content of components selected from Al, Mg, S, K, Ca, Fe, Ni, As, Ag, Sb and Bi is 1 wt % or less is introduced (for instance, refer to Patent Document 3).

Patent Documents 4 to 6 refer to the eddy current in magnetron sputtering.

In particular, Patent Document 6 describes that the eddy current that occurs due to the rotation of the magnet in magnetron sputtering deteriorate the uniformity of the film, and illustrates the use of aluminum alloy or copper alloy wherein the specific resistance is $3.0\mu\Omega\cdot cm$ or greater and the strength is 150 MPa or greater.

Among the above, the Examples describe industrial aluminum alloy of $4.9\mu\Omega\cdot cm$ and 182 MPa, and brass of $7.2\mu\Omega\cdot cm$ (24% IACS) and 320 MPa; and the Comparative Examples describe Al-0.5Cu of 75 MPa, and a Cu—Cr backing plate of $2.1\mu\Omega\cdot cm$ (82% IACS) and 465 MPa.

Further, Patent Document 7 proposes a backing plate material capable of preventing thermocompression bonding with the target with Cu having a purity of 99.7% and adding a subelement of 100 to 3000 wtppm (0.01 to 0.3 wt %). The added element in this case is of an extremely minute amount, and a backing plate material placing emphasis on thermal conductance is being proposed.

[Patent Document 1] U.S. Pat. No. 5,269,899
[Patent Document 2] Japanese Patent Laid-Open Publication No. H10-330929
[Patent Document 3] Japanese Patent Laid-Open Publication No. H11-236665
[Patent Document 4] Japanese Patent Laid-Open Publication No. H3-134170
[Patent Document 5] Japanese Patent Laid-Open Publication No. H10-195649
[Patent Document 6] Japanese Patent Laid-Open Publication No. 2001-329362
[Patent Document 7] Japanese Patent Laid-Open Publication No. H1-180975

Nevertheless, the foregoing conventional backing plates have the following problems.

As a specific example, there is minute copper wiring (for instance the 90, 65 nm wiring rule) formed with the Damascene Process. With this process, after forming a barrier film of tantalum or tantalum nitride in the wiring groove, a copper or copper alloy film is sputtered as a seed layer. Nevertheless, in order to form this kind of thin seed layer, it is necessary to improve the ionization ratio of the sputtered particles via high-power sputtering so as to control the deposition.

For example, with the brass backing plate described in the Examples of Patent Document 6, sufficient uniformity of the film cannot be obtained. Further, with the Cu—Cr backing plate described in the Comparative Examples, there is a problem in that sufficient uniformity cannot be obtained due to the magnet rotation involving the eddy current.

Every backing plate described in the foregoing Patent Documents is not suitable and has problems. Detailed explanation will be provided based on the Examples and Comparative Examples described later.

SUMMARY OF THE INVENTION

An object of the present invention is to provide a copper or copper alloy target/copper alloy backing plate assembly in which the anti-eddy current characteristics and other characteristics required in a magnetron sputtering target are simultaneously pursued in a well balanced manner.

The present invention provides:
1. A copper or copper alloy target/copper alloy backing plate assembly for use in magnetron sputtering, wherein the copper alloy backing plate is formed from low beryllium copper alloy containing 0.2 to 0.5 wt % of Be, or Cu—Ni—Si alloy or Cu—Ni—Si-based alloy containing 2 to 4 wt % of Ni and 0.3 to 0.9 wt % of Si;

2. The copper or copper alloy target/copper alloy backing plate assembly according to paragraph 1 above, wherein the Cu—Ni—Si-based alloy backing plate is formed from Cu—Ni—Si-based alloy containing 2 to 4 wt % of Ni, 0.3 to 0.9 wt % of Si, 0.1 to 0.9 wt % of Cr or 0.1 to 0.9 wt % of Mg;

3. A copper or copper alloy target/copper alloy backing plate assembly for use in magnetron sputtering, wherein the copper alloy backing plate has an electrical conductivity of 35 to 60% (IACS), and 0.2% proof stress of 400 to 850 MPa;

4. The copper or copper alloy target/copper alloy backing plate assembly according to paragraph 1 or paragraph 2 above, wherein the copper alloy backing plate has an electrical conductivity of 35 to 60% (IACS), and 0.2% proof stress of 400 to 850 MPa;

5. The copper or copper alloy target/copper alloy backing plate assembly according to any one of paragraphs 1 to 4 above, wherein the copper or copper alloy target/copper alloy backing plate assembly is diffusion bonded; and 6. The copper or copper alloy target/copper alloy backing plate assembly according to paragraph 5 above, wherein the diffusion bonding temperature is 175 to 450° C.

The copper alloy backing plate of the present invention is extremely effective in that there is hardly any warping after diffusion bonding a copper or copper alloy (copper-based alloy) sputtering target having the same level of thermal expansion coefficient as the copper alloy backing plate. Further, it is possible to obtain a copper or copper alloy target/copper alloy backing plate assembly in which the anti-eddy current characteristics and other characteristics required in a magnetron sputtering target are simultaneously pursued in a well balanced manner. There is another significant effect in that the uniformity of the sputtered film is also favorable.

DETAILED DESCRIPTION OF THE INVENTION

The copper alloy backing plate of the copper or copper alloy target/copper alloy backing plate assembly of the present invention for use in magnetron sputtering is formed from low beryllium copper alloy containing 0.2 to 0.5 wt % of Be, or Cu—Ni—Si alloy or Cu—Ni—Si-based alloy containing 2 to 4 wt % of Ni and 0.3 to 0.9 wt % of Si. As the Cu—Ni—Si-based alloy, it is desirable to use Cu—Ni—Si-based alloy containing 2 to 4 wt % of Ni, 0.3 to 0.9 wt % of Si, 0.1 to 0.9 wt % of Cr or 0.1 to 0.9 wt % of Mg.

Further, it is desirable that the copper alloy backing plate of the copper or copper alloy target/copper alloy backing plate assembly of the present invention for use in magnetron sputtering has an electrical conductivity of 35 to 60% (IACS), and 0.2% proof stress of 400 to 850 MPa. Incidentally, IACS represents the electrical conductivity of the annealed copper standard ($1.7241\mu\Omega\cdot cm$) at 100%.

The low beryllium copper alloy containing 0.2 to 0.5 wt % of Be, or Cu—Ni—Si alloy or Cu—Ni—Si-based alloy containing 2 to 4 wt % of Ni and 0.3 to 0.9 wt % of Si are all backing plate materials satisfying the foregoing conditions. As the copper alloy backing plate material, copper alloy materials added with other subelements may also be used so as long as they have the foregoing electrical conductivity and proof stress.

Generally, copper alloy with high specific resistance and high strength is considered effective. Nevertheless, copper alloy with high specific resistance (low electrical conductivity) is able to reduce the eddy current, but the thermal conductance proportionally related to conductivity will relatively decrease. Thus, electrical conductivity (% IACS) at 35 to 60% is preferable, and a copper alloy backing plate having a strength of 0.2% proof stress of 400 to 850 MPa is most preferable.

It is desirable that the copper or copper alloy target/copper alloy backing plate assembly of the present invention is solidly bonded with diffusion bonding. In particular, with high power sputtering exceeding 30 kW, it is optimum to bond the target/backing plate with diffusion bonding.

With a low melting point brazing filler material such as indium, the bond part will separate due to the heat generation during sputtering. Further, with a high melting point solder material such as silver solder, the structurally controlled target will deteriorate.

In addition, diffusion bonding must be performed under temperature conditions of not deteriorating the backing plate material in which the electrical conductivity and strength have been optimally controlled.

Deterioration of the backing plate material during diffusion bonding or after diffusion bonding may deteriorate the bonding strength as a result of an embrittled portion being formed due to the reaction at the bonded interface.

The upper limit temperature during bonding is 450° C. In other words, it is desirable to keep the diffusion bonding temperature in the range of 175 to 450° C. If the temperature is within this scope, embrittlement reaction will not occur between the copper or copper alloy (copper-based alloy) sputtering target and the copper alloy backing plate, and the target will hardly be contaminated due to diffusion from the backing plate.

EXAMPLES

The Examples and Comparative Example are now explained. Incidentally, these Examples are merely illustrative, and the present invention shall in no way be limited thereby. In other words, the present invention shall only be limited by the scope of claim for a patent, and shall include the various modifications other than the Examples of this invention.

Examples 1 to 3 and Comparative Examples 1 to 11

The target and sputtering conditions shown in Examples 1 to 3 and Comparative Example 1 to 11 are as follows.
Target: High purity copper (6N), diameter: φ350 mm, thickness: 12 mm
Bonding of target/backing plate: Diffusion bonding at 450° C.
Total thickness: 17 mm
Sputtering power: 30 kW A list of the copper material or alloy type (number) and the specific composition of the copper or copper alloy used in Examples 1 to 3 and Comparative Examples 1 to 11 is shown in Table 1. Incidentally, in Table 1, C18000 and C18150 represent numbers of the CDA (Copper Development Association). In addition, C7025 (4-digit numbers) and so on represent numbers of JIS (Japanese Industrial Standards). Further, the rotating speed of magnet, rotational fluctuation, uniformity and evaluation are shown in Table 2. Moreover, the electrical conductivity rate and 0.2% proof stress of Examples 1 to 3 and Comparative Examples 1 to 11 are shown in Table 3.

As shown in Table 2, Examples 1 to 3 all show favorable rotating speed of magnet, rotational fluctuation and uniformity, and the comprehensive evaluation is superior or favorable. Meanwhile, Comparative Examples 1 to 11 have inferior uniformity and the comprehensive evaluation thereof is also inferior other than the ordinary beryllium copper and Cu—Cr-based copper alloy which were average in the comprehensive evaluation.

For example, since the brass in Comparative Example 2 has low electrical conductivity, the eddy current is low and the magnet rotation is favorable without much fluctuation. Nevertheless, since the thermal conductivity is low, heat of the target rises, and there is significant stress between the target and backing plate. As a result, the uniformity will be inferior. Further, since the backing plate has low strength, it is not able to hold down this stress.

With the phosphor bronze or aluminum bronze of Comparative Examples 5 and 6, the eddy current is even lower, and the magnetic field is formed favorably. Nevertheless, heat loss of the target is so inferior that even if the backing plate has sufficient strength, the sputtering speed would become too fast, and the uniformity will change throughout the target life, and this is inappropriate.

Further, Cu-0.3 wt % Ni of Comparative Example 10 and Cu-0.2 wt % Ni-0.1 wt % Si of Comparative Example 11 intend to prevent the thermocompression of the backing plate and target by adding a trace element and maintain high thermal conductance, but the result was that the uniformity considerably deteriorated from the mid phase to late phase of sputtering.

Moreover, Table 3 shows the relationship of the electrical conductivity and 0.2% proof stress, and the copper alloy backing plate of the present invention is within the favorable scope.

Accordingly, it is evident that the copper or copper alloy target/copper alloy backing plate assembly of the present invention is superior in comparison to conventional technology.

TABLE 1

| | Type of Copper or Copper Alloy (Number) | Composition of Copper or Copper Alloy |
|---|---|---|
| Example 1 | Low beryllium copper (C17530) | Cu—2.1%(Ni + Co)—0.3%Be |
| Example 2 | (C7025) | Cu—3%Ni—0.65%Si—0.15%Mg |
| Example 3 | (C18000) | Cu—3%Ni—0.65%Si—0.15%Cr |
| Comparative Example 1 | Beryllium copper (C1720) | Cu—0.2%(Ni + Co)—1.9%Be |
| Comparative Example 2 | Brass (C2600) | Cu—30%Zn |
| Comparative Example 3 | Oxygen free copper (C1020) | Cu 99.96% or greater |
| Comparative Example 4 | Chromium copper | Cu—1.2%Cr |
| Comparative Example 5 | Phosphor bronze (C5191) | Cu—6%Sn—0.1%P |
| Comparative Example 6 | Aluminum bronze (C6161) | Cu—9%Al—4%Fe—1.5%(Ni + Mn) |
| Comparative Example 7 | Cu—Fe-based copper alloy | Cu—2.3%Fe |
| Comparative Example 8 | Cu—Zr-based copper alloy | Cu—0.1%Zr |
| Comparative Example 9 | Cu—Cr—Zr-based copper alloy (C18150) | Cu—1.5%Cr—0.15%Zr |
| Comparative Example 10 | Cu—Ni-based copper alloy | Cu—0.3wt%Ni |
| Comparative Example 11 | Cu—Ni—Si-based copper alloy | Cu—0.2wt%Ni—0.1wt%Si |

C18000 and C18150 represent numbers of the CDA (Copper Development Association). In addition, C7025 (4-digit numbers) and so on represent numbers of JIS (Japanese Industrial Standards).

TABLE 2

| | Rotating Speed of Magnet (Brass 100%) | Rotational Fluctuation ± % | Uniformity (Initial Phase of Sputtering) | Uniformity (Mid Phase of Sputtering) | Uniformity (Late Phase of Sputtering) | Evaluation |
|---|---|---|---|---|---|---|
| Example 1 | 95 | <0.5 | Favorable | Favorable | Favorable | Favorable |
| Example 2 | 95 | <0.5 | Favorable | Favorable | Favorable | Superior |
| Example 3 | 96 | <0.5 | Favorable | Favorable | Favorable | Favorable |
| Comparative Example 1 | 101 | <0.5 | Average | Average | Favorable | Average |
| Comparative Example 2 | 100 | <0.5 | Favorable | Inferior | Inferior | Inferior |
| Comparative Example 3 | 87 | <2.5 | Average | Inferior | Inferior | Inferior |
| Comparative Example 4 | 91 | <1.5 | Average | Inferior | Inferior | Inferior |
| Comparative Example 5 | 104 | <0.5 | Inferior | Average | Favorable | Inferior |

TABLE 2-continued

|  | Rotating Speed of Magnet (Brass 100%) | Rotational Fluctuation ± % | Uniformity (Initial Phase of Sputtering) | Uniformity (Mid Phase of Sputtering) | Uniformity (Late Phase of Sputtering) | Evaluation |
|---|---|---|---|---|---|---|
| Comparative Example 6 | 105 | <0.5 | Inferior | Average | Favorable | Inferior |
| Comparative Example 7 | 92 | <1.5 | Average | Inferior | Inferior | Inferior |
| Comparative Example 8 | 89 | <1.5 | Average | Average | Average | Average |
| Comparative Example 9 | 90 | <1.5 | Average | Average | Inferior | Inferior |
| Comparative Example 10 | 89 | <1.5 | Average | Inferior | Inferior | Inferior |
| Comparative Example 11 | 93 | <1.5 | Average | Inferior | Inferior | Inferior |

TABLE 3

|  | Electrical Conductivity (% IACS) | 0.2% Proof Stress (MPa) |
|---|---|---|
| Example 1 | 38 | 790 |
| Example 2 | 52 | 540 |
| Example 3 | 45 | 560 |
| Comparative Example 1 | 25 | 1100 |
| Comparative Example 2 | 24 | 280 |
| Comparative Example 3 | 101 | 60 |
| Comparative Example 4 | 82 | 450 |
| Comparative Example 5 | 18 | 480 |
| Comparative Example 6 | 14 | 610 |
| Comparative Example 7 | 70 | 370 |
| Comparative Example 8 | 95 | 310 |
| Comparative Example 9 | 85 | 380 |
| Comparative Example 10 | 88 | 160 |
| Comparative Example 11 | 68 | 250 |

A copper alloy backing plate is extremely effective in that there is hardly any warping after diffusion bonding a copper or copper alloy (copper-based alloy) sputtering target having the same level of thermal expansion coefficient as the copper alloy backing plate. Further, it is possible to obtain a copper or copper alloy target/copper alloy backing plate assembly in which the anti-eddy current characteristics and other characteristics required in a magnetron sputtering target are simultaneously pursued in a well balanced manner. There is another significant effect in that the uniformity of the sputtered film is also favorable. Accordingly, this is particularly useful in high-power sputtering of 30 kW or greater.

The invention claimed is:

1. A target and backing plate assembly for use in magnetron sputtering, comprising a copper or copper alloy target having a back face and a copper alloy backing plate diffusion bonded directly to said back face, the copper alloy backing plate being made of a Cu based alloy selected from the group consisting of:
   a Cu—Be-based alloy consisting of Cu, Be, Ni, and Co, wherein the Cu—Be based alloy has a content of Be of 0.2 to 0.5 wt %,
   or a Cu—Ni—Si-based alloy consisting of Cu, Ni, Si, and one additional element, wherein the one additional element is selected from the group consisting of Cr or Mg, and wherein the Cu—Ni—Si based alloy has a content of Ni of 2 to 4 wt % and a content of Si of 0.3 to 0.9 wt%.

2. The assembly according to claim 1, wherein the Cu—Ni—Si-based alloy contains Cr or Mg in a content of 0.1 to 0.9 wt %.

3. The assembly according to claim 2, wherein the Cu-based alloy backing plate has an electrical conductivity of 35 to 60% (IACS), and 0.2% proof stress of 400 to 850 MPa.

4. The assembly according to claim 2, wherein the diffusion bonded assembly is bonded at a diffusion bonding temperature of 175 to 450° C.

5. The assembly according to claim 1, wherein the Cu-based alloy backing plate has an electrical conductivity of 35 to 60% (IACS), and 0.2% proof stress of 400 to 850 MPa.

6. The assembly according to claim 5, wherein the diffusion bonded assembly is bonded at a diffusion bonding temperature of 175 to 450° C.

7. The assembly according to claim 1, wherein the diffusion bonded assembly is bonded at a diffusion bonding temperature of 175 to 450° C.

8. The assembly according to claim 1, wherein the Cu—Be-based alloy consists of 97.6wt % Cu, 0.3wt % Be and 2.1wt % in total of Ni and Co.

9. The assembly according to claim 8, wherein the Cu-based alloy backing plate has an electrical conductivity of 35 to 60% (IACS), and 0.2% proof stress of 400 to 850 MPa.

10. The assembly according to claim 8, wherein the diffusion bonded assembly is bonded at a diffusion bonding temperature of 175 to 450° C.

* * * * *